United States Patent
Cheng et al.

(10) Patent No.: US 11,693,072 B2
(45) Date of Patent: Jul. 4, 2023

(54) MAGNETIC RESONANCE WATER-FAT IMAGE SEPARATION METHOD AND APPARATUS, IMAGING SYSTEM AND STORAGE MEDIUM

(71) Applicant: Siemens Healthcare GmbH, Erlangen (DE)

(72) Inventors: Shi Cheng, Shenzhen (CN); Kun Zhou, Shenzhen (CN); De He Weng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/585,901

(22) Filed: Jan. 27, 2022

(65) Prior Publication Data

US 2022/0236355 A1 Jul. 28, 2022

(30) Foreign Application Priority Data

Jan. 27, 2021 (CN) .............................. 202110113075

(51) Int. Cl.
*G01R 33/48* (2006.01)
*G06T 7/262* (2017.01)
*G01R 33/56* (2006.01)

(52) U.S. Cl.
CPC ..... *G01R 33/4828* (2013.01); *G01R 33/5608* (2013.01); *G06T 7/262* (2017.01); *G06T 2207/10088* (2013.01)

(58) Field of Classification Search
None
See application file for complete search history.

(56) References Cited

U.S. PATENT DOCUMENTS 10,459,059 B2  10/2019  Eggers
2016/0033605 A1  2/2016  Stemmer et al.
(Continued)

FOREIGN PATENT DOCUMENTS

WO  2014162218 A1  10/2014
WO  2017207700 A1  12/2017
WO  2019157246 A1  8/2019

OTHER PUBLICATIONS

Eggers Holger et al., "Dual-Echo Dixon Imaging with Flexible Choice of Echo Times", Magnetic Resonance in Medicine, vol. 65, 2011, pp. 96-107, DOI: 10.1002/mrm.22578; 2011.
(Continued)

*Primary Examiner* — Rodney E Fuller
(74) *Attorney, Agent, or Firm* — Banner & Witcoff Ltd.

(57) ABSTRACT

In a MR water-fat image separation method and device, within one echo period, a first echo set under a first readout gradient polarity and a second echo set under a second readout gradient polarity are acquired. The first and second readout gradient polarities may be opposite, and echoes in the first echo set may be positionally one-to-one symmetric to echoes in the second echo set with respect to the echo center of the echo period. A first echo image set is obtained based on first echo set data acquired in each echo period, and a second echo image set is obtained based on second echo set data acquired in each echo period. Using the first and second echo image sets, a Dixon water-fat separation calculation is performed to obtain a water image and a fat image. The method and device can advantageously increase acquisition efficiency and the signal-to-noise ratio.

15 Claims, 7 Drawing Sheets

(56) References Cited

U.S. PATENT DOCUMENTS

2016/0033606 A1  2/2016 Eggers
2018/0299526 A1* 10/2018 Eggers .................. G01R 33/58
2020/0319280 A1* 10/2020 Eggers ............... G01R 33/5618

OTHER PUBLICATIONS

Jong Bum Son et al., "A flexible fast spin echo triple-echo Dixon technique" Magnetic Resonance in Medicine, 2017;77(3):1049-1057. doi:10.1002/mrm.26186; 2017.
Li, Zhiqiang et al.: "Rapid water and lipid imaging with T2 mapping using a radial IDEAL-GRASE technique"; Magnetic Resonance in Medicine, John Wiley & Sons, Inc, United States; 10 pgs.; 2009.
Sheng, Shi et al.: "Combined Echo Two-Point Dixon method for high efficiency water/fat seperation"; Proceedings of the 2021 ISMRM & SMRT Annual Meeting & Exhibition; 4 pgs.; 2021.
Li, Zhiqiang et al.: "Fast decomposition of water and lipid using a grase technique with the IDEAL algorithm"; Magnetic Resonance in Medicine; 11 pgs.; 2007.

* cited by examiner

MAGNETIC RESONANCE WATER-FAT IMAGE SEPARATION METHOD AND APPARATUS, IMAGING SYSTEM AND STORAGE MEDIUM

CROSS REFERENCE TO RELATED APPLICATIONS

This patent application claims priority to Chinese Patent Application No. 202110113075.0, filed Jan. 27, 2021, which is incorporated herein by reference in its entirety.

BACKGROUND

Field

The present disclosure relates to the technical field of magnetic resonance imaging, in particular to a magnetic resonance imaging water-fat image separation method and apparatus, a magnetic resonance imaging system and a computer readable storage medium.

Related Art

In a magnetic resonance imaging (MRI) system, due to the fact that hydrogen atom nuclei in water and hydrogen atom nuclei in fat inside the human body are in different molecular environments, their resonant frequencies are different; when hydrogen protons in fat and other tissues are excited by an RF pulse at the same time, their relaxation times are also different. When signals are acquired at different echo times, fat tissue and water exhibit different phases and signal intensities.

The Dixon method is a method used to produce a pure water proton image in MRI, the basic principle thereof being to separately acquire two types of echo signals, namely in-phase and out-of-phase echo signals, of water and fat protons; the two types of signals with different phases undergo arithmetic operations, each producing a pure water proton image and a pure fat proton image, thereby achieving the objective of fat suppression. At present, there are many types of Dixon water-fat image separation methods, including the single-point Dixon method, the two-point Dixon method and the three-point Dixon method, etc.

In a Dixon-based turbo spin echo (TSE, also called fast spin echo, FSE) pulse sequence, the radio frequency (RF) pulse sequence includes a 90° excitation pulse and a 180° refocusing pulse (also called a rephasing pulse), and multiple echoes can be acquired between two adjacent refocusing pulses, i.e. within one echo interval (also called an echo period). Echoes at corresponding positions corresponding to different refocusing pulses form a set of echoes, for example: a first echo appearing after refocusing pulse 1, a first echo appearing after refocusing pulse 2, . . . , a first echo appearing after refocusing pulse n can form one set of echoes, and a second echo appearing after refocusing pulse 1, a second echo appearing after refocusing pulse 2, . . . , a second echo appearing after refocusing pulse n can form another set of echoes. An image can be independently reconstructed from each set of echoes. Because different echoes carry different amplitude and phase information, a pure water image and a pure fat image can be separately reconstructed by further calculation.

In view of the fact that some of the existing water-fat image separation methods have a large number of dead zones and a low acquisition efficiency, while some have a low signal-to-noise ratio (SNR), those skilled in the art are still committed to searching for other solutions.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
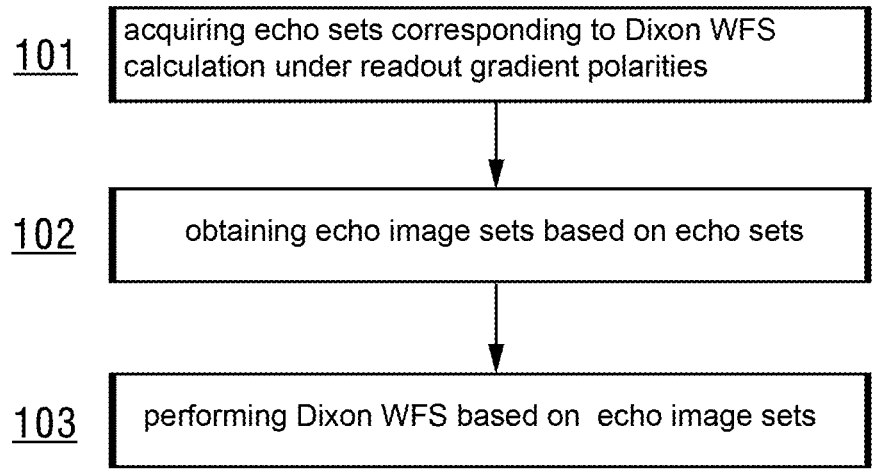
FIG. 1 is a flowchart of the MRI water-fat image separation method according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of the above, embodiments of the present disclosure propose an MRI water-fat image separation method, and further propose an MRI water-fat image separation apparatus, an MRI system and a computer readable storage medium, in order to increase the acquisition efficiency and SNR.

An MRI water-fat image separation method proposed in embodiments of the present disclosure comprises: within one echo period, acquiring a first echo set corresponding to Dixon water-fat separation calculation under a first readout gradient polarity, and acquiring a second echo set corresponding to Dixon water-fat separation calculation under a second readout gradient polarity, wherein the first readout gradient polarity and the second readout gradient polarity are opposite, and echoes in the second echo set are located at positions that are positionally symmetric to echoes in the first echo set with respect to the echo center of the echo period; obtaining a first echo image set based on first echo set data acquired in each echo period, and obtaining a second echo image set based on second echo set data acquired in each echo period; and using the first echo image set and the second echo image set to perform Dixon water-fat separation calculation, to obtain a water image and a fat image.

In one embodiment, the first echo set and the second echo set each comprise: one nearly-in-phase echo meeting a set in-phase requirement and one nearly-out-of-phase echo meeting a set out-of-phase requirement; and the Dixon water-fat separation calculation is two-point Dixon water-fat separation calculation; alternatively, the first echo set and the second echo set each comprise: one nearly-in-phase echo meeting a set in-phase requirement and two nearly-out-of-phase echoes meeting a set out-of-phase requirement; and the Dixon water-fat separation calculation is three-point Dixon water-fat separation calculation.

In one embodiment, the step of using the first echo image set and the second echo image set to perform Dixon water-fat separation calculation, to obtain a water image and a fat image, comprises: separately subjecting each pair of echo images with symmetrical echo positions in the first echo image set and the second echo image set to phase difference correction, then separately subjecting each pair of echo images resulting from phase difference correction to complex averaging, to obtain a corresponding echo averaged image set; and using the images in the echo averaged image set obtained to perform Dixon water-fat separation calculation, to obtain a water image and a fat image.

In one embodiment, the step of separately subjecting each pair of echo images with symmetrical echo positions in the first echo image set and the second echo image set to phase difference correction, comprises: subjecting either one of each pair of echo images with symmetrical echo positions in the first echo image set and the second echo image set to complex conjugate transformation, to obtain a first processing image; subtracting, from the first processing image or the other echo image that has not undergone complex conjugate transformation, a low-pass phase difference between the first processing image and the echo image that has not undergone complex conjugate transformation, to obtain a second processing image, wherein the second processing image and the echo image which has not had the low-pass phase difference subtracted therefrom together form two echo images resulting from phase difference correction.

In one embodiment, the step of using the first echo image set and the second echo image set to perform Dixon water-fat separation calculation, to obtain a water image and a fat image, comprises: using the first echo image set to perform Dixon water-fat separation calculation, to obtain a first water image and a first fat image; using the second echo image set to perform Dixon water-fat separation calculation, to obtain a second water image and a second fat image; subjecting the first water image and the second water image to modulus averaging, to obtain a water image; and subjecting the first fat image and the second fat image to modulus averaging, to obtain a fat image.

An MRI water-fat image separation apparatus proposed in embodiments of the present disclosure comprises: a data acquisition module, for: within one echo period, acquiring a first echo set corresponding to Dixon water-fat separation calculation under a first readout gradient polarity, and acquiring a second echo set corresponding to Dixon water-fat separation calculation under a second readout gradient polarity, wherein the first readout gradient polarity and the second readout gradient polarity are opposite, and echoes in the second echo set are located at positions that are positionally symmetric to echoes in the first echo set with respect to the echo center of the echo period; an image extraction module, for obtaining a first echo image set based on first echo set data acquired in each echo period, and obtaining a second echo image set based on second echo set data acquired in each echo period; a water-fat separation module, for using the first echo image set and the second echo image set to perform Dixon water-fat separation calculation, to obtain a water image and a fat image.

In one embodiment, the first echo set and the second echo set each comprise: one nearly-in-phase echo meeting a set in-phase requirement and one nearly-out-of-phase echo meeting a set out-of-phase requirement; and the Dixon water-fat separation calculation is two-point Dixon water-fat separation calculation; alternatively, the first echo set and the second echo set each comprise: two nearly-in-phase echoes meeting a set in-phase requirement and one nearly-out-of-phase echo meeting a set out-of-phase requirement; and the Dixon water-fat separation calculation is three-point Dixon water-fat separation calculation.

In one embodiment, the water-fat separation module comprises: a first image integration module, for separately subjecting each pair of echo images with symmetrical echo positions in the first echo image set and the second echo image set to phase difference correction, then separately subjecting each pair of echo images resulting from phase difference correction to complex averaging, to obtain a corresponding echo averaged image set; and a first water-fat separation calculation module, for using the images in the echo averaged image set obtained to perform Dixon water-fat separation calculation, to obtain a water image and a fat image.

In one embodiment, the first image integration module comprises: a complex conjugate transformation module, for subjecting either one of each pair of echo images with symmetrical echo positions in the first echo image set and the second echo image set to complex conjugate transformation, to obtain a first processing image; a phase correction module, for subtracting, from the first processing image or the other echo image that has not undergone complex conjugate transformation, a low-pass phase difference between the first processing image and the echo image that has not undergone complex conjugate transformation, to obtain a second processing image; wherein the second processing image and the echo image which has not had the low-pass phase difference subtracted therefrom together form two echo images resulting from phase difference correction; and a complex averaging module, for separately subjecting each pair of echo images resulting from phase difference correction to complex averaging, to obtain a corresponding echo averaged image set.

In one embodiment, the water-fat separation module comprises: a second water-fat separation calculation module, for using the first echo image set to perform Dixon water-fat separation calculation, to obtain a first water image and a first fat image; and using the second echo image set to perform Dixon water-fat separation calculation, to obtain a second water image and a second fat image; and a second image integration module, for subjecting the first water image and the second water image to modulus averaging, to obtain a water image; and subjecting the first fat image and the second fat image to modulus averaging, to obtain a fat image.

An MRI water-fat image separation apparatus proposed in embodiments of the present disclosure comprises: at least one memory and at least one processor, wherein: the at least one memory is configured to store a computer program; the at least one processor is configured to call the computer program stored in the at least one memory, and perform the MRI water-fat image separation method as described in any one of the embodiments above.

An MRI system proposed in embodiments of the present disclosure comprises the MRI water-fat image separation apparatus as described in any one of the embodiments above.

A computer readable storage medium proposed in embodiments of the present disclosure has a computer program stored thereon, wherein the computer program is executable by a processor and realizes the MRI water-fat image separation method as described in any one of the embodiments above.

It can be seen from the solution above that because two echo sets corresponding to Dixon water-fat separation calculation are read in one echo period in embodiments of the present disclosure, nearly all of the time between two refocusing pulses is used for data acquisition, thus increasing the data acquisition efficiency and reducing dead zones. Moreover, each echo set is read out under the same readout gradient polarity, so there is no need to perform phase correction in each echo set.

In addition, the echo images corresponding to the two echo sets can undergo image merging to increase SNR followed by water-fat separation calculation, or undergo water-fat separation calculation followed by image merging to increase SNR; compared with a conventional TSE-Dixon water-fat separation calculation method, the number of echoes obtained in a very similar capture time is doubled, so the SNR is increased, and better water-fat imaging quality is achieved. Furthermore, by implementing the phase correction process before averaging in the merging process, it is possible to reduce redundancy and ensure consistency of local and global water-fat separation results.

In embodiments of the present disclosure, account is taken of the fact that at the present time, in order to increase the acquisition speed and reduce motion sensitivity, a fast-switching bipolar readout gradient can be used during data acquisition to acquire multiple echoes between each pair of refocusing pulses. In addition, account is taken of the fact that a recently developed Dixon reconstruction method allows sampling of nearly-out-of-phase (approximately out of phase, e.g. 120°-180°) and nearly-in-phase (approximately in phase, e.g. 0°-30°) echoes, rather than precisely out-of-phase and in-phase echoes, as was the case with the original Dixon method. Thus, in this embodiment, consideration is given to the following: acquiring two echo sets between each pair of refocusing pulses, each echo set comprising nearly out-of-phase and nearly-in-phase echoes for corresponding Dixon water-fat separation calculation, in order to increase the data acquisition speed. In addition, when using the acquired echo images to perform Dixon water-fat separation calculation, the images corresponding to different echo sets may be subjected to processing consisting of merging followed by water-fat separation calculation, or water-fat separation calculation followed by merging, thereby increasing the SNR of the water image and the fat image.

In order to clarify the object, technical solution and advantages of the present disclosure, the present disclosure is explained in further detail below by way of embodiments.

FIG. 1 is a demonstrative flow chart of the MRI water-fat image separation method in an embodiment of the present disclosure. As FIG. 1 shows, the method may comprise the following steps:

Step 101: within one echo period, acquiring a first echo set corresponding to Dixon water-fat separation calculation under a first readout gradient polarity, and acquiring a second echo set corresponding to Dixon water-fat separation calculation under a second readout gradient polarity, wherein the first readout gradient polarity and the second readout gradient polarity are opposite, and echoes in the first echo set are positionally one-to-one symmetric to echoes in the second echo set with respect to the echo center of the echo period, i.e. the echoes in the second echo set are located at positions that are positionally symmetric to the echoes in the first echo set with respect to the echo center of the echo period.

Figure 2A:
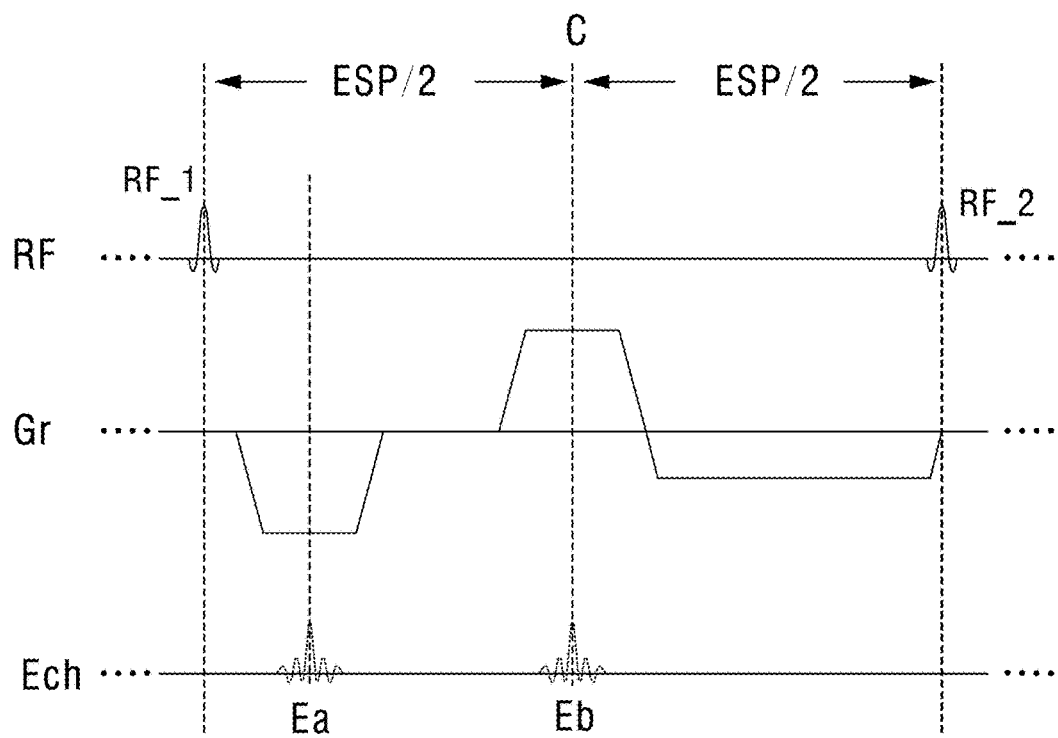
FIG. 2A is a schematic diagram of a data acquisition sequence of an existing two-point Dixon method based on a turbo spin echo (TSE) sequence according to an exemplary embodiment of the disclosure.
Figure 2B:
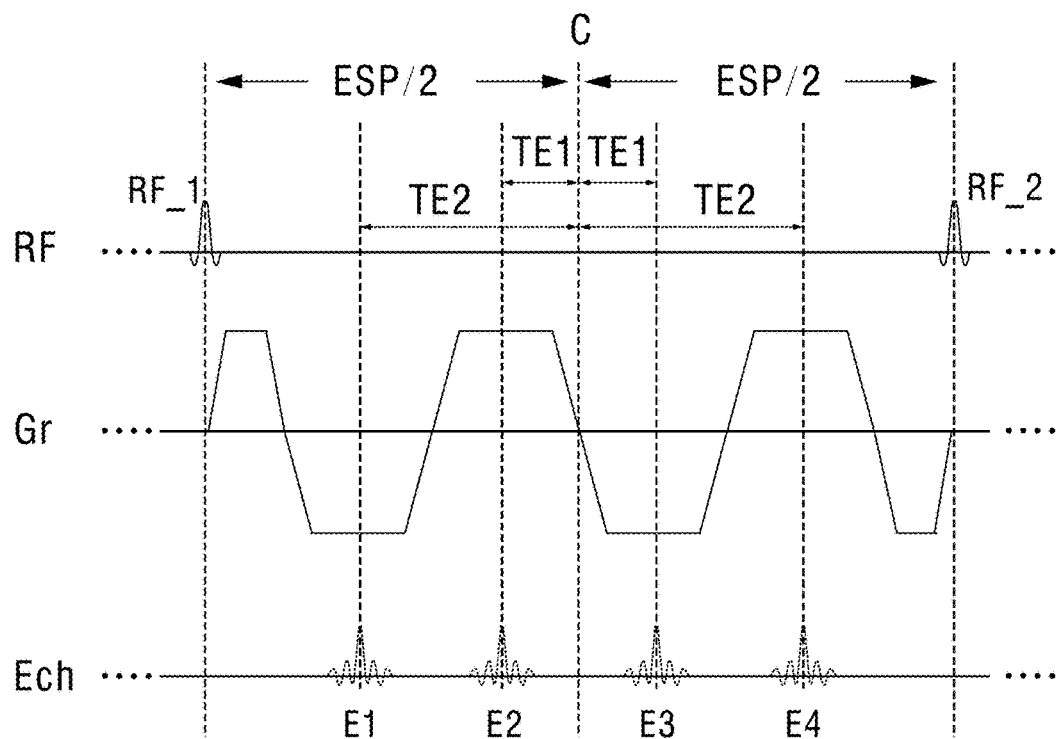
FIG. 2B is a schematic diagram of a data acquisition sequence of a two-point Dixon method based on a turbo spin echo (TSE) sequence according to an exemplary embodiment of the disclosure.
Figure 2C:
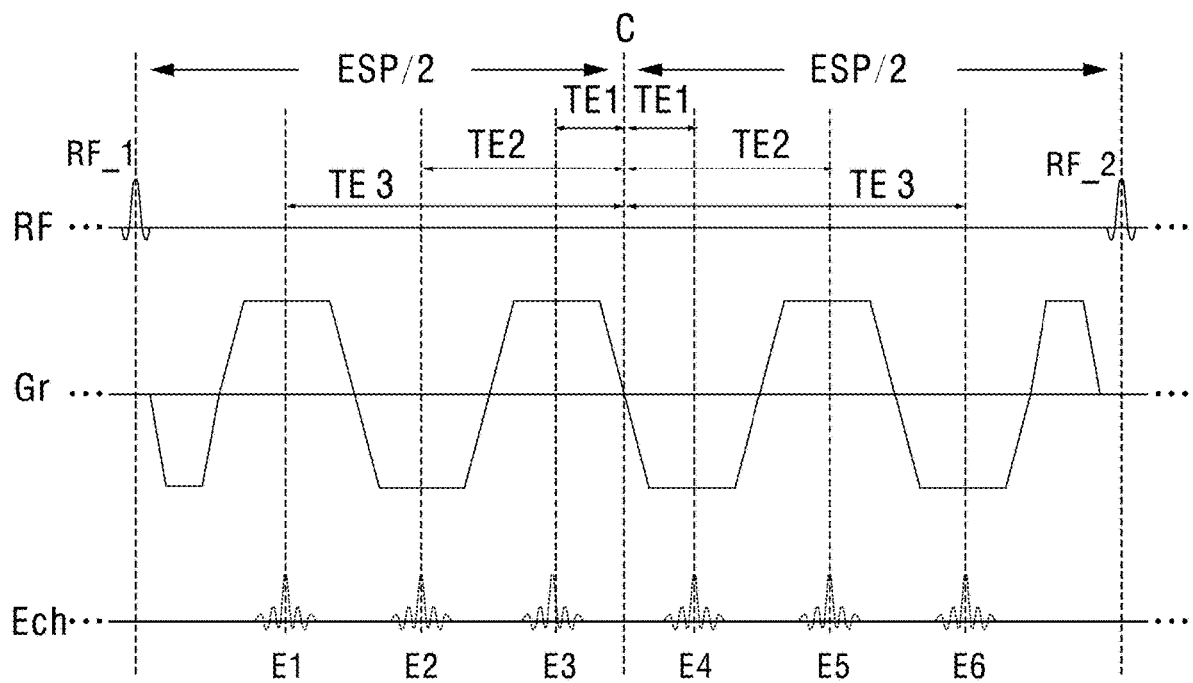
FIG. 2C is a schematic diagram of a data acquisition sequence of a three-point Dixon method based on a turbo spin echo (TSE) sequence according to an exemplary embodiment of the disclosure.

FIG. 2A shows a schematic diagram of a data acquisition sequence of an existing two-point Dixon method based on a turbo spin echo (TSE) sequence. FIG. 2B shows a schematic diagram of a data acquisition sequence of a two-point Dixon method based on a turbo spin echo (TSE) sequence in one example of the present disclosure, and FIG. 2C is a schematic diagram of a data acquisition sequence of a three-point Dixon method based on a turbo spin echo (TSE) sequence in one example of the present disclosure. Only one spin echo period (echo spacing, ESP) is shown in FIGS. 2A-2C. One repetition time includes multiple spin echo periods as shown in FIGS. 2A-2C, i.e. multiple 180-degree rephasing RF pulses are included between two 90-degree RF pulses. RF, Gr and Ech correspond to the RF pulse, readout direction gradient and echo data, respectively.

As shown in FIG. 2A, within one spin echo period of the echo sequence, i.e. between two 180-degree rephasing RF pulses RF_1 and RF_2, the MRI equipment applies a readout gradient in the readout gradient direction, and reads an out-of-phase echo Ea and an in-phase echo Eb.

As shown in FIG. 2B, within one spin echo period of the echo sequence, i.e. between two 180-degree rephasing RF pulses RF_1 and RF_2, at first echo times (TE1) and second echo times (TE2) which are symmetrically distant from the echo center C, the MRI equipment applies two readout gradients in the readout gradient direction, reads four corresponding echoes E1, E2, E3, E4 based on the effect of the readout gradients, and puts the four echoes E1, E2, E3, E4 that are read into k-space. Echoes E1 and E3 are read out under the same readout gradient polarity and form an echo pair corresponding to a two-point Dixon water-fat separation algorithm; echoes E2 and E4 are read out under the same readout gradient polarity and form another echo pair corresponding to a two-point Dixon water-fat separation algorithm. These two echo pairs have the same dephasing factor, but opposite gradient polarities. Readout is repeated throughout the echo sequence. Each echo pair, E1 and E3, E2 and E4, is obtained with the same readout gradient polarity, and water-fat separation can be performed without performing phase correction. Echoes E2 and E3 are nearly-in-phase echoes which meet a set in-phase requirement and are positionally symmetric with respect to the echo center C of the echo period, with a complex conjugate relationship therebetween; echoes E1 and E4 are nearly-out-of-phase echoes which meet a set out-of-phase requirement and are positionally symmetric with respect to the echo center C of the echo period, with a complex conjugate relationship therebetween.

Of course, in other examples, the choice of TEs of echoes E2, E3 and echoes E1, E4 is flexible; as long as water-fat separation is stable, noise amplification is acceptable. For example, when using a 1.5 T system, echoes E2, E3 and echoes E1, E4 are nearly in phase and out of phase, respectively. When using a 3T system, they can set in another way, i.e. echoes E2, E3 are nearly out of phase, while echoes E1, E4 are nearly in phase.

As can be seen, for the two-point Dixon water-fat separation calculation method shown in FIG. 2, the first echo set and the second echo set are each an echo pair comprising one nearly-in-phase echo meeting a set in-phase requirement and one nearly-out-of-phase echo meeting a set out-of-phase requirement.

As shown in FIG. 2C, within one spin echo period of the echo sequence, i.e. between two 180-degree rephasing RF pulses RF_1 and RF_2, at first echo times (TE1), second echo times (TE2) and third echo times (TE3) which are symmetrically distant from the echo center C, the MRI equipment applies three readout gradients in the readout gradient direction, reads six corresponding echoes E1, E2, E3, E4, E5, E6 based on the effect of the readout gradients, and puts the six echoes E1, E2, E3, E4, E5, E6 that are read into k-space. Echoes E1, E3 and E5 are read out under the same readout gradient polarity and form an echo set corresponding to a three-point Dixon water-fat separation algorithm; echoes E2, E4 and E6 are read out under the same readout gradient polarity and form another echo set corresponding to a three-point Dixon water-fat separation algorithm. These two echo sets have the same dephasing factor, but opposite gradient polarities. Readout is repeated throughout the echo sequence. Each echo set, E1, E3 and E5, E2, E4 and E6, is obtained with the same readout gradient polarity, and water-fat separation can be performed without performing phase correction. Echoes E3 and E4 are nearly-in-phase echoes which meet a set in-phase requirement and are positionally symmetric with respect to the echo center C of the echo period, with a complex conjugate relationship therebetween; echoes E1 and E6 are nearly-out-of-phase echoes which meet a set out-of-phase requirement and are positionally symmetric with respect to the echo center C of the echo period, with a complex conjugate relationship therebetween; and echoes E5 and E2 are also nearly-out-of-phase echoes which meet a set out-of-phase requirement and are positionally symmetric with respect to the echo center C of the echo period, with a complex conjugate relationship therebetween.

As can be seen, for the three-point Dixon water-fat separation calculation method, the first echo set and the second echo set may each comprise: one nearly-in-phase echo meeting a set in-phase requirement and two nearly-out-of-phase echoes meeting a set out-of-phase requirement. Moreover, the nearly-in-phase echo in the first echo set and the nearly-in-phase echo in the second echo set are positionally symmetric with respect to the echo center of the echo period, and the two nearly-out-of-phase echoes in the first echo set and the two nearly-out-of-phase echoes in the second echo set are positionally symmetric with respect to the echo center of the echo period.

In addition, this embodiment is likewise suitable for other Dixon water-fat separation calculation methods. An item-by-item description is not repeated here.

Step 102: obtaining a first echo image set based on first echo set data acquired in each echo period, and obtaining a second echo image set based on second echo set data acquired in each echo period.

In this step, a first echo image set is obtained based on the first echo set data acquired in each echo period of the echo sequence in k-space, and a second echo image set is obtained based on the second echo set data acquired in each echo period of the echo sequence in k-space.

Taking the data acquisition sequence shown in FIG. 2B as an example, an out-of-phase image corresponding to E1 can be obtained for data of echo E1 acquired in each echo period in k-space; an in-phase image corresponding to E3 can be obtained for data of echo E3 acquired in each echo period in k-space; and the out-of-phase image corresponding to E1 and the in-phase image corresponding to E3 together form the first echo image set. By the same principle, an in-phase image corresponding to E2 can be obtained for data of echo E2 acquired in each echo period in k-space; an out-of-phase image corresponding to E4 can be obtained for data of echo E4 acquired in each echo period in k-space; and the in-phase image corresponding to E2 and the out-of-phase image corresponding to E4 together form the second echo image set.

Step 103: using the first echo image set and the second echo image set to perform Dixon water-fat separation calculation, to obtain a water image and a fat image.

In this step, when particular implementation is performed, two implementation methods are possible:

First Implementation Method: Image Merging Followed by Water-Fat Separation Calculation Each pair of echo images with symmetrical echo positions in the first echo image set and the second echo image set is separately subjected to phase difference correction, each pair of echo images that has undergone phase difference correction is then separately subjected to complex averaging, thereby obtaining a corresponding echo averaged image set by merging; then the images in the echo averaged image set obtained are used to perform Dixon water-fat separation calculation, to obtain a water image and a fat image. Specifically, the process of subjecting the two echo images with symmetrical echo positions to phase difference correction may comprise: subjecting either one of the two echo images with symmetrical echo positions to complex conjugate transformation, to obtain a first processing image; subtracting, from the first processing image or the other echo image that has not undergone complex conjugate transformation, a low-pass phase difference between the first processing image and the echo image that has not undergone complex conjugate transformation, to obtain a second processing image; wherein the second processing image and the echo image which has not had the low-pass phase difference subtracted therefrom together form the two echo images resulting from phase difference correction.

Figure 3:
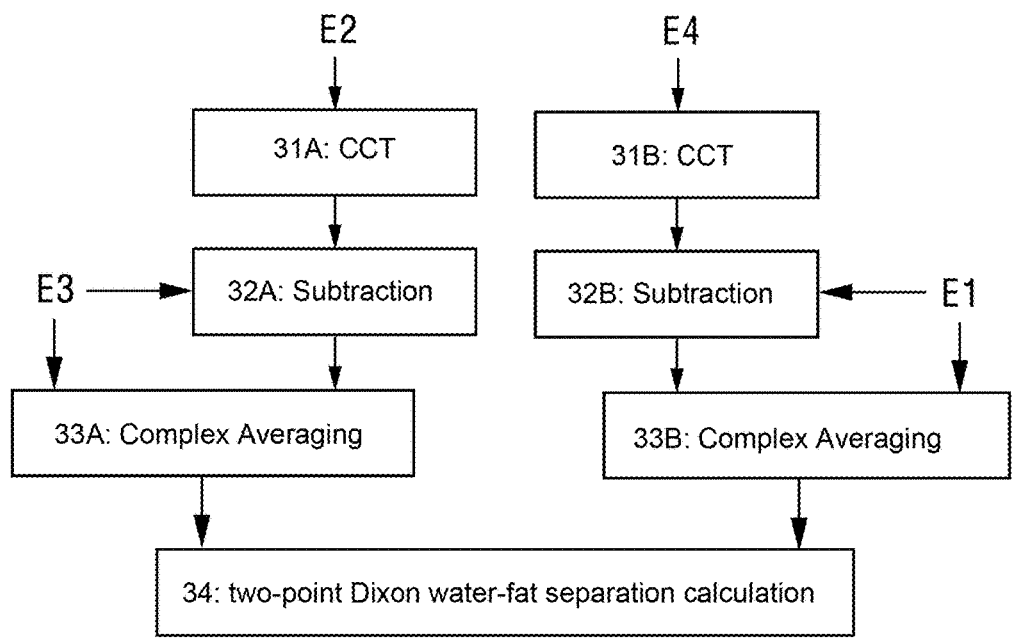
FIG. 3 is a flowchart of a process of using acquired images to perform image reconstruction with water-fat separation according to an exemplary embodiment of the disclosure.

Still taking the data acquisition sequence shown in FIG. 2B as an example, FIG. 3 shows a schematic diagram of the process of using acquired images to perform image reconstruction with water-fat separation in one example of the present disclosure. As shown in FIG. 3, after obtaining the first echo image set formed of the out-of-phase image corresponding to E1 and the in-phase image corresponding to E3, and the second echo image set formed of the in-phase image corresponding to E2 and the out-of-phase image corresponding to E4, which were mentioned in step 102, due to the fact that the out-of-phase image corresponding to E1 and the out-of-phase image corresponding to E4 are two images with symmetrical echo positions, and the in-phase image corresponding to E3 and the in-phase image corresponding to E2 are two images with symmetrical echo positions, the two images with symmetrical echo positions can be subjected to phase difference correction first; when particular processing is performed, the two images with positional symmetry have equal status, and either one may be taken as the standard for performing phase difference correction calculation. Only one implementation situation is shown in FIG. 3, and this may for example comprise the following steps:

Step 31A: subjecting the in-phase image corresponding to E2 to complex conjugate transformation, to obtain a first in-phase processing image; step 31B: subjecting the out-of-phase image corresponding to E4 to complex conjugate transformation, to obtain a first out-of-phase processing image.

In other embodiments, step 31A may also comprise subjecting the in-phase image corresponding to E3 to complex conjugate transformation, and by the same principle, step 31B may also comprise subjecting the out-of-phase image corresponding to E1 to complex conjugate transformation.

Step 32A, subtracting, from the first in-phase processing image, a low-pass phase difference between the first in-phase processing image and the in-phase image corresponding to E3, to obtain a second in-phase processing image; step 32B, subtracting, from the first out-of-phase processing image, a low-pass phase difference between the first out-of-phase processing image and the out-of-phase image corresponding to E1, to obtain a second out-of-phase processing image.

In other embodiments, step 32A may also comprise subtracting, from the in-phase image corresponding to E3, the low-pass phase difference between the first in-phase processing image and the in-phase image corresponding to E3, and by the same principle, step 32B may also comprise subtracting, from the out-of-phase image corresponding to E1, the low-pass phase difference between the first out-of-phase processing image and the out-of-phase image corresponding to E1.

Step 33A: subjecting the second in-phase processing image and the in-phase image corresponding to E3 to complex averaging, and integrating the two images as an echo averaged in-phase image; step 33B, subjecting the second out-of-phase processing image and the out-of-phase image corresponding to E1 to complex averaging, and integrating the two images as an echo averaged out-of-phase image.

Step 34: using the echo averaged in-phase image and the echo averaged out-of-phase image to perform two-point Dixon water-fat separation calculation, to obtain a water image and a fat image.

In addition, the three-point Dixon water-fat separation method is similar, so an item-by-item description is not repeated here.

Second Implementation Method: Water-Fat Separation Calculation Followed by Image Merging The first echo image set is used to perform Dixon water-fat separation calculation, to obtain a first water image and a first fat image; the second echo image set is used to perform Dixon water-fat separation calculation, to obtain a second water image and a second fat image; the first water image and the second water image are subjected to modulus averaging, to obtain a water image; and the first fat image and the second fat image are subjected to modulus averaging, to obtain a fat image.

Figure 4:
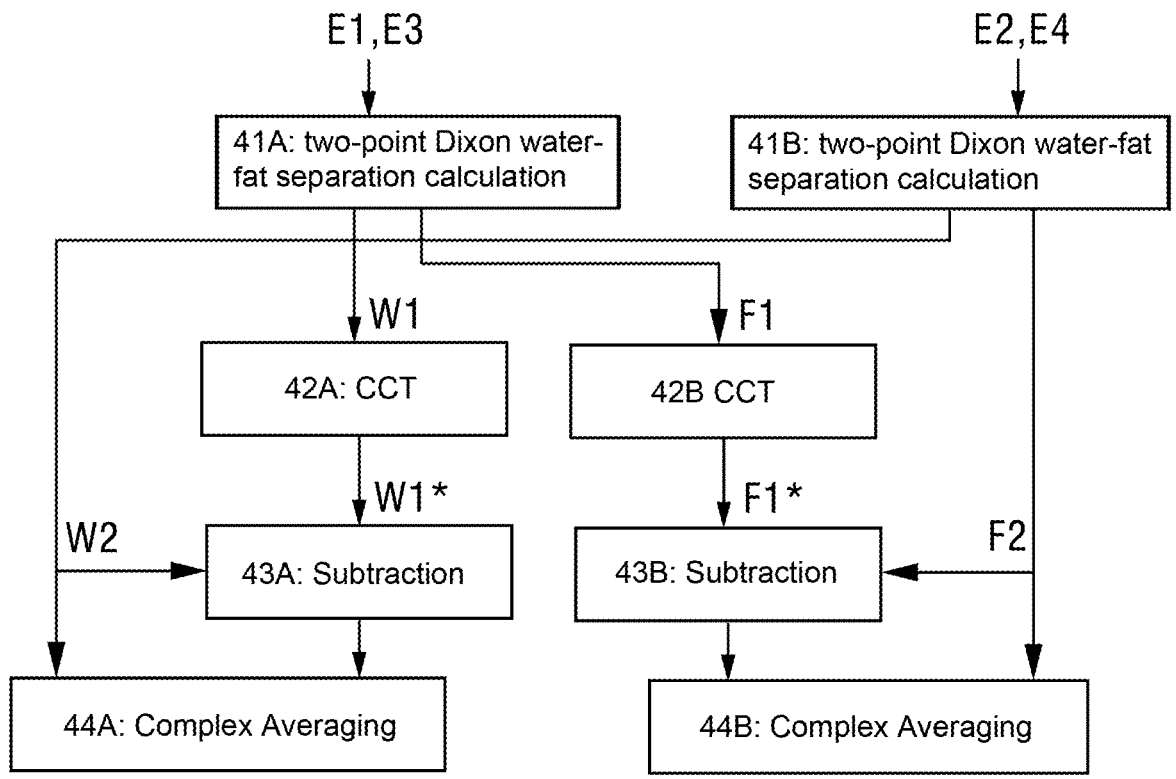
FIG. 4 is a flowchart of a process of using acquired images to perform image reconstruction with water-fat separation according to an exemplary embodiment of the disclosure.

Still taking the data acquisition sequence shown in FIG. 2B as an example, FIG. 4 shows a schematic diagram of the process of using acquired images to perform image reconstruction with water-fat separation in another example of the present disclosure. As FIG. 4 shows, the process may comprise the following steps:

Step 41A: using the out-of-phase image corresponding to E1 and the in-phase image corresponding to E3 to perform two-point Dixon water-fat separation calculation, to obtain a first water image W1 and a first fat image F1; step 41B: using the in-phase image corresponding to E2 and the out-of-phase image corresponding to E4 to perform two-point Dixon water-fat separation calculation, to obtain a second water image W2 and a second fat image F2.

Step 42A: subjecting the first water image W1 to complex conjugate transformation, to obtain a first processing water image W1*; step 42B: subjecting the first fat image F1 to complex conjugate transformation, to obtain a first processing fat image F1*.

In other embodiments, step 42A may also comprise subjecting the second water image to complex conjugate transformation, and step 42B may also comprise subjecting the second fat image to complex conjugate transformation.

Step 43A: subtracting, from the first processing water image, a low-pass phase difference between the first processing water image and the second water image, to obtain a second processing water image; step 43B: subtracting, from the first processing fat image, a low-pass phase difference between the first processing fat image and the second fat image, to obtain a second processing fat image.

Step 44A: subjecting the second processing water image and the second water image to complex averaging, to obtain a water image by integration; step 44B: subjecting the second processing fat image and the second fat image to complex averaging, to obtain a fat image by integration.

The MRI water-fat image separation method in embodiments of the present disclosure has been described in detail above; the MRI water-fat image separation apparatus in embodiments of the present disclosure is described in detail below. The MRI water-fat image separation apparatus in embodiments of the present disclosure can be used to implement the MRI water-fat image separation method in embodiments of the present disclosure. For particulars not disclosed in detail in the apparatus embodiments of the present disclosure, reference can be made to the corresponding description in the method embodiments of the present disclosure; an item-by-item description is not repeated here.

Figure 5A:
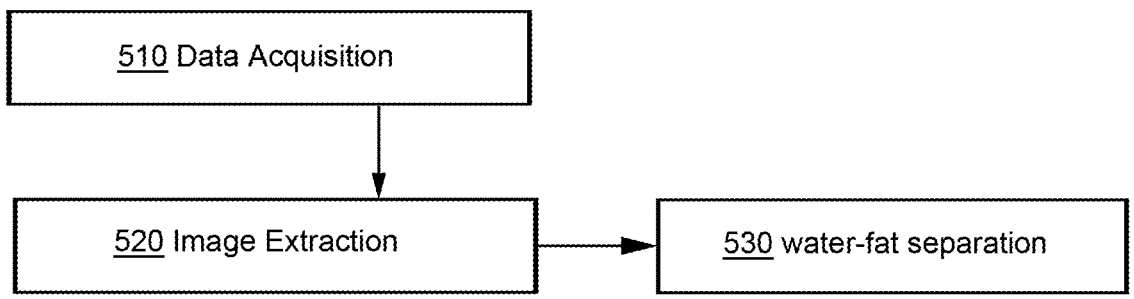
FIGS. 5A-5C illustrate a MRI water-fat image separation apparatus according to exemplary embodiments of the disclosure.
Figure 5B:
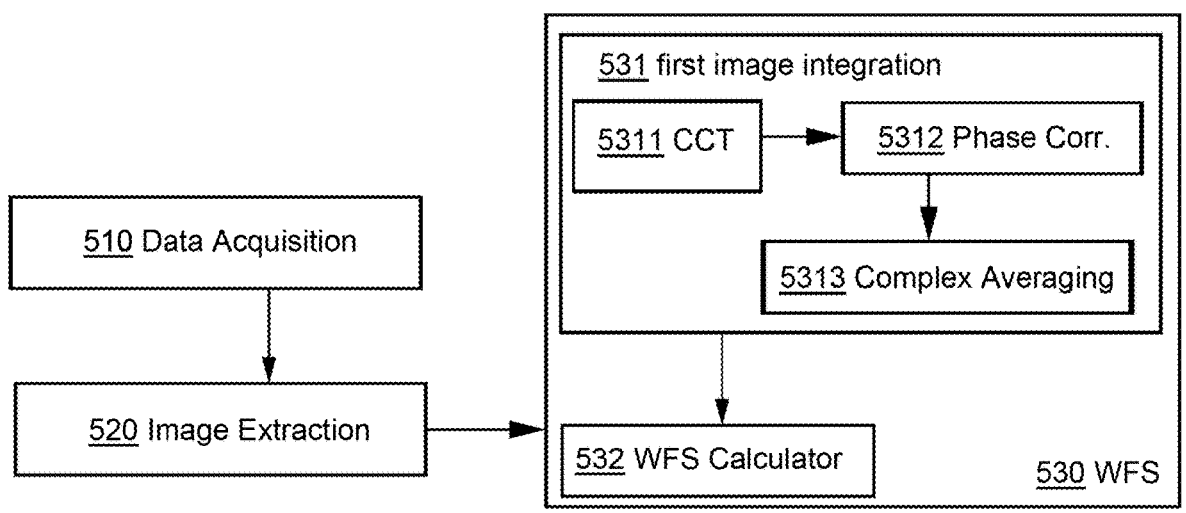
Figure 5C:
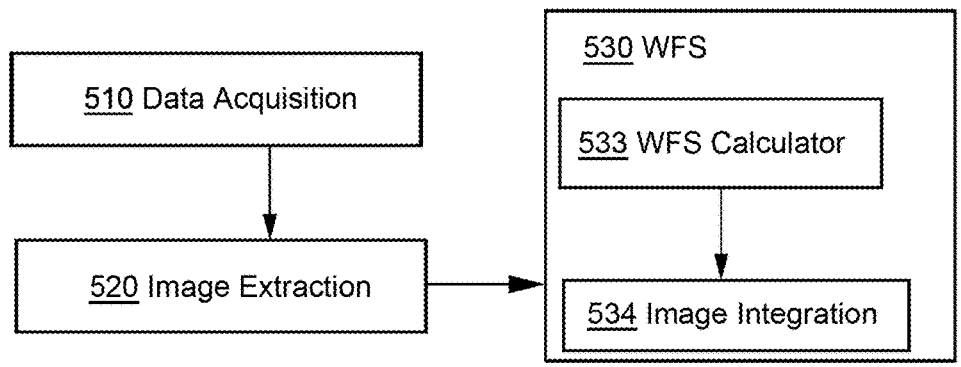

FIGS. 5A-5C are demonstrative structural diagrams of the MRI water-fat image separation apparatus in embodiments of the present disclosure. As shown in FIG. 5A, the apparatus may comprise: a data acquisition module 510, an image extraction module 520 and a water-fat separation module 530.

The data acquisition module 510 is used for: within one echo period, acquiring a first echo set corresponding to Dixon water-fat separation calculation under a first readout gradient polarity, and acquiring a second echo set corresponding to Dixon water-fat separation calculation under a second readout gradient polarity, wherein the first readout gradient polarity and the second readout gradient polarity are opposite, and echoes in the first echo set are positionally one-to-one symmetric to echoes in the second echo set with respect to the echo center of the echo period, i.e. the echoes in the second echo set are located at positions that are positionally symmetric to the echoes in the first echo set with respect to the echo center of the echo period.

The image extraction module 520 is used for obtaining a first echo image set based on first echo set data acquired in each echo period, and obtaining a second echo image set based on second echo set data acquired in each echo period.

The water-fat separation module 530 is used for using the first echo image set and the second echo image set to perform Dixon water-fat separation calculation, to obtain a water image and a fat image.

The first echo set and the second echo set each comprise: one nearly-in-phase echo meeting a set in-phase requirement and one nearly-out-of-phase echo meeting a set out-of-phase requirement; and the Dixon water-fat separation calculation is two-point Dixon water-fat separation calculation; alternatively, the first echo set and the second echo set each comprise: two nearly-in-phase echoes meeting a set in-phase requirement and one nearly-out-of-phase echo meeting a set out-of-phase requirement; and the Dixon water-fat separation calculation is three-point Dixon water-fat separation calculation.

In particular implementation, the water-fat separation module 530 may be implemented in various ways; FIGS. 5B and 5C each show one of these.

In one embodiment as shown in FIG. 5B, the water-fat separation module 530 may comprise: a first image integration module 531 and a first water-fat separation calculation module 532. The first image integration module 531 is used for separately subjecting each pair of echo images with symmetrical echo positions in the first echo image set and the second echo image set to phase difference correction, then separately subjecting each pair of echo images that has undergone phase difference correction to complex averaging, to obtain a corresponding echo averaged image set. The first water-fat separation calculation module 532 is used for using the images in the echo averaged image set obtained to perform Dixon water-fat separation calculation, to obtain a water image and a fat image.

The first image integration module 531 may comprise: a complex conjugate transformation module 5311, a phase correction module 5312 and a complex averaging module 5313.

The complex conjugate transformation module 5311 is used for subjecting either one of each pair of echo images with symmetrical echo positions in the first echo image set and the second echo image set to complex conjugate transformation, to obtain a first processing image.

The phase correction module 5312 is used for subtracting, from the first processing image or the other echo image that has not undergone complex conjugate transformation, a low-pass phase difference between the first processing image and the echo image that has not undergone complex conjugate transformation, to obtain a second processing image; wherein the second processing image and the echo image which has not had the low-pass phase difference subtracted therefrom together form the two echo images resulting from phase difference correction.

The complex averaging module 5313 is used for separately subjecting each pair of echo images that has undergone phase difference correction to complex averaging, to obtain a corresponding echo averaged image set.

In another embodiment as shown in FIG. 5B, the water-fat separation module 530 may comprise: a second water-fat separation calculation module 533 and a second image integration module 534.

The second water-fat separation calculation module 533 is used for using the first echo image set to perform Dixon water-fat separation calculation, to obtain a first water image and a first fat image; and using the second echo image set to perform Dixon water-fat separation calculation, to obtain a second water image and a second fat image.

The second image integration module 534 is used for subjecting the first water image and the second water image to modulus averaging, to obtain a water image; and subjecting the first fat image and the second fat image to modulus averaging, to obtain a fat image.

Figure 6:
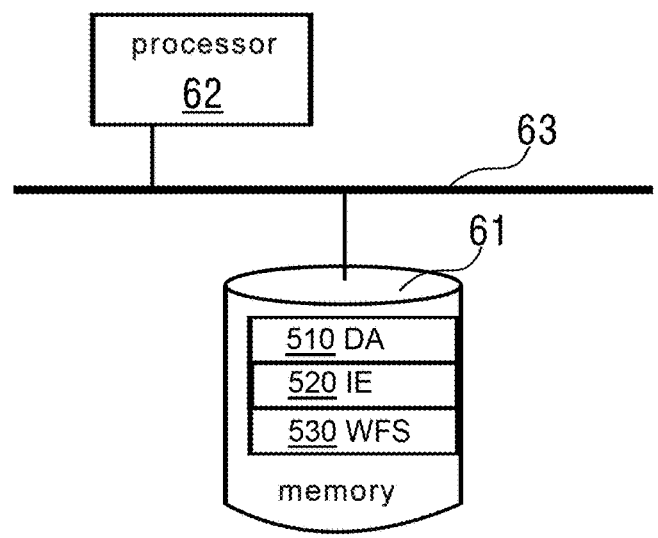
FIG. 6 illustrates a MRI water-fat image separation apparatus according to an exemplary embodiment of the disclosure.

FIG. 6 is a demonstrative structural diagram of another MRI water-fat image separation apparatus in embodiments of the present disclosure. As shown in FIG. 6, the apparatus may comprise: at least one memory 61 and at least one processor 62. In addition, some other components may also be included, such as a communication port, etc. These components communicate via a bus 63.

The at least one memory 61 is configured to store a computer program. In one embodiment, the computer program may be understood to comprise all of the modules of the MRI water-fat image separation apparatus shown in FIG. 5. Furthermore, the at least one memory 61 may also store an operating system, etc. Operating systems include but are not limited to: an Android operating system, a Symbian operating system, a Windows operating system and a Linux operating system, etc.

The at least one processor 62 is configured to call the computer program stored in the at least one memory 61, to perform the MRI water-fat image separation method described in embodiments of the present disclosure. The processor 62 may be a CPU, a processing unit/module, an ASIC, a logic module or a programmable gate array, etc. It can receive and send data via the communication port.

It must be explained that not all of the steps and modules in the flows and structural diagrams above are necessary; certain steps or modules may be omitted according to actual requirements. The order in which steps are executed is not fixed, but may be adjusted as required. The partitioning of the modules is merely functional partitioning, employed for the purpose of facilitating description; during actual implementation, one module may be realized by multiple modules, and the functions of multiple modules may be realized by the same module; these modules may be located in the same device, or in different devices.

It can be understood that hardware modules in the embodiments above may be realized mechanically or electronically. For example, one hardware module may comprise a specially designed permanent circuit or logic device (such as a dedicated processor, such as an FPGA or ASIC) for completing a specific operation. The hardware module may also comprise a programmable logic device or circuit that is temporarily configured by software (e.g. comprising a general processor or another programmable processor) for executing a specific operation. The choice of whether to specifically use a mechanical method, or a dedicated permanent circuit, or a temporarily configured circuit (e.g. configured by software) to realize the hardware module can be decided according to considerations of cost and time.

In addition, in an embodiment of the present disclosure, a computer readable storage medium is further provided, having stored thereon a computer program that can be executed by a processor and realize the MRI water-fat image separation method described in embodiments of the present disclosure. Specifically, a system or apparatus equipped with a storage medium may be provided; software program code realizing the function of any one of the embodiments above is stored on the storage medium, and a computer (or CPU or MPU) of the system or apparatus is caused to read and execute the program code stored in the storage medium. Furthermore, it is also possible to cause an operating system etc. operating on a computer to complete a portion of, or all, actual operations by means of an instruction based on program code. It is also possible for program code read out from the storage medium to be written into a memory installed in an expansion board inserted in the computer, or written into a memory installed in an expansion unit connected to the computer, and thereafter instructions based on the program code cause a CPU etc. installed on the expansion board or expansion unit to execute a portion of and all actual operations, so as to realize the function of any one of the embodiments above. Embodiments of storage media used for providing program code include floppy disks, hard disks, magneto-optical disks, optical disks (such as CD-ROM, CD-R, CD-RW, DVD-ROM, DVD-RAM, DVD-RW, DVD+RW), magnetic tapes, non-volatile memory cards and ROM. Optionally, program code may be downloaded from a server computer via a communication network.

Figures 7A, 7B, 7C:
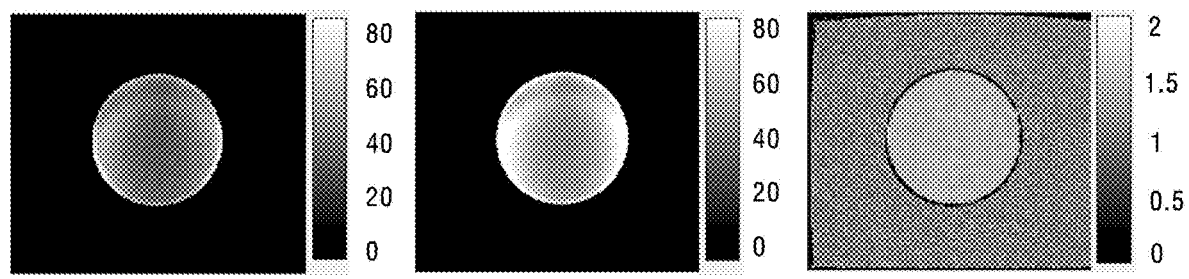
FIGS. 7A and 7B illustrate an image quality comparison of in vitro phantom water images obtained using a conventional two-point Dixon water-fat separation algorithm and the MRI water-fat image separation method according to an exemplary embodiment of the disclosure, respectively.
FIG. 7C illustrates ratio results for the two images in FIGS. 7B and 7A, according to an exemplary embodiment of the disclosure.

FIGS. 7A and 7B show image quality comparison figures of in vitro phantom water images obtained using a conventional two-point Dixon water-fat separation algorithm and the MRI water-fat image separation method in an embodiment of the present disclosure respectively, in one example, while FIG. 7C shows a schematic figure of ratio results for the two images in FIGS. 7B and 7A. In this example, the Siemens Integrated Development Environment for Application (IDEA) is used to implement a sequence image reconstruction prototype system, and the in vitro phantom experiment is conducted on a Siemens instrument with a magnetic field strength of 0.55 T. As shown in FIG. 7C, the image obtained by the MRI water-fat image separation method in an embodiment of the present disclosure has a 30%-40% higher SNR than the image obtained by the conventional two-point Dixon water-fat separation algorithm. As can be seen, for the same acquisition efficiency, the image quality is higher when the MRI water-fat image separation method in an embodiment of the present disclosure is used.

Figure 8A:
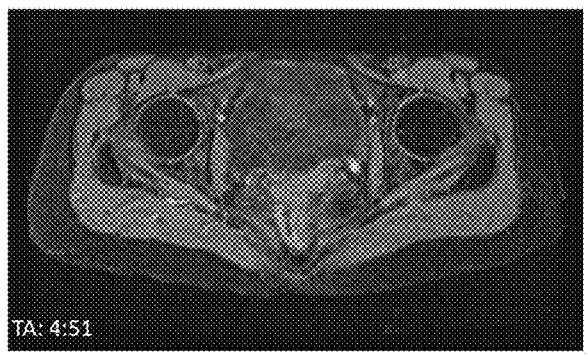
FIGS. 8A and 8B show an image quality comparison of hip joint water images obtained using the MRI water-fat image separation method and a combined-echo two-point Dixon water-fat separation algorithm with sampling performed twice, according to an exemplary embodiment of the disclosure.
Figure 8B:

FIGS. 8A and 8B show image quality comparison figures of hip joint water images obtained using a combined-echo two-point Dixon water-fat separation algorithm with sampling performed twice and the MRI water-fat image separation method in an embodiment of the present disclosure, in one example. FIG. 8A is the hip joint water image obtained using the combined-echo two-point Dixon water-fat separation algorithm with sampling performed twice; FIG. 8B is the hip joint water image obtained using the MRI water-fat image separation method in an embodiment of the present disclosure. The protocol parameters used in both cases include: FOV (field of view)=285×380×300 mm2, matrix size=180×320, sampling bandwidth=401 Hz/pixel, slice thickness=6 mm, number of slices=25, TE/TR for the two cases (echo time/repetition time)=22/778 and 17/650, sampling time TA corresponding to FIG. 8A=2 minutes 18 seconds, sampling time TA corresponding to FIG. 8B=1 minute 55 seconds.

As can be seen, the image quality is similar in FIGS. 8B and 8A, but the sampling time corresponding to FIG. 8B is shorter than the sampling time corresponding to FIG. 8A. As can be seen, for the same imaging quality, the sampling efficiency is higher when the MRI water-fat image separation method in an embodiment of the present disclosure is used.

It can be seen from the solution above that because two echo sets corresponding to Dixon water-fat separation calculation are read in one echo period in embodiments of the present disclosure, nearly all of the time between two refocusing pulses is used for data acquisition, thus increasing the data acquisition efficiency and reducing dead zones. Moreover, each echo set is read out under the same readout gradient polarity, so there is no need to perform phase correction in each echo set.

In addition, the echo images corresponding to the two echo sets can undergo image merging to increase SNR followed by water-fat separation calculation, or undergo water-fat separation calculation followed by image merging to increase SNR; compared with a conventional TSE-Dixon water-fat separation calculation method, the number of echoes obtained in a very similar capture time is doubled, so the SNR is increased, and better water-fat imaging quality is achieved. Furthermore, by implementing the phase correction process before averaging in the merging process, it is possible to reduce redundancy and ensure consistency of local and global water-fat separation results.

Additionally, because less echo spacing time is needed to realize the same dephasing factor, there is less T2 blurring, so that a longer echo sequence can reduce the scanning time. Alternatively, with the same echo spacing time, the technical solution in embodiments of the present disclosure applies a lower readout gradient strength, resulting in less image distortion and less misregistration between water and fat images.

The embodiments above are merely preferred embodiments of the present disclosure, which are not intended to limit it. Any amendments, equivalent substitutions or improvements etc. made within the spirit and principles of the present disclosure shall be included in the scope of protection thereof.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

REFERENCE LIST 101-103, Operations
31A-34
41A-44B
510 data acquisition module
520 image extraction module
530 water-fat separation module
531 first image integration module
5311 complex conjugate transformation module
5312 phase correction module
5313 complex averaging module
532 first water-fat separation calculation module
533 second water-fat separation calculation module
534 second image integration module
61 memory
62 processor
63 bus

The invention claimed is:

1. A magnetic resonance imaging (MRI) water-fat image separation method, comprising:
within an echo period, acquiring a first echo set corresponding to a Dixon water-fat separation calculation under a first readout gradient polarity, and acquiring a second echo set corresponding to the Dixon water-fat separation calculation under a second readout gradient polarity, wherein the first readout gradient polarity and the second readout gradient polarity are opposite, echoes in the second echo set being located at positions that are positionally symmetric to echoes in the first echo set with respect to an echo center of the echo period;
obtaining a first echo image set based on first echo set data acquired in each echo period;
obtaining a second echo image set based on second echo set data acquired in each echo period, wherein the first echo set and the second echo set each comprise:
one nearly-in-phase echo meeting a set in-phase requirement and one nearly-out-of-phase echo meeting a set out-of-phase requirement, the Dixon water-fat separation calculation being a two-point Dixon water-fat separation calculation; or
one nearly-in-phase echo meeting a set in-phase requirement and two nearly-out-of-phase echoes meeting a set out-of-phase requirement, the Dixon water-fat separation calculation being three-point Dixon water-fat separation calculation; and
performing a Dixon water-fat separation calculation, based on the first echo image set and the second echo image set, to obtain a water image and a fat image.

2. The MRI water-fat image separation method as claimed in claim 1, wherein performing the Dixon water-fat separation calculation to obtain the water image and the fat image comprises:
separately subjecting each pair of echo images with symmetrical echo positions in the first echo image set and the second echo image set to phase difference correction;
separately subjecting each pair of echo images resulting from phase difference correction to complex averaging to obtain a corresponding echo averaged image set; and
using images in the echo averaged image set obtained to perform the Dixon water-fat separation calculation to obtain the water image and the fat image.

3. The MRI water-fat image separation method as claimed in claim 2, wherein separately subjecting each pair of echo images to phase difference correction comprises:
subjecting either one of each pair of echo images with symmetrical echo positions in the first echo image set and the second echo image set to complex conjugate transformation, to obtain a first processing image; and
determining a difference of (a) the first processing image or the other echo image that has not undergone complex conjugate transformation and (b) a low-pass phase difference between the first processing image and the echo image that has not undergone complex conjugate transformation, to obtain a second processing image,
wherein the second processing image and the echo image which has not had the low-pass phase difference subtracted therefrom together form two echo images resulting from phase difference correction.

4. The MRI water-fat image separation method as claimed in claim 1, wherein performing the Dixon water-fat separation calculation to obtain the water image and the fat image comprises:
performing a Dixon water-fat separation calculation based on the first echo image set to obtain a first water image and a first fat image;
performing a Dixon water-fat separation calculation based on the second echo image set to obtain a second water image and a second fat image;
subjecting the first water image and the second water image to modulus averaging to obtain a water image; and
subjecting the first fat image and the second fat image to modulus averaging to obtain a fat image.

5. A non-transitory computer-readable storage medium with an executable program stored thereon, that when executed, instructs a processor to perform the method of claim 1.

6. A magnetic resonance imaging (MRI) water-fat image separation apparatus, comprising:
a memory storing a computer program; and
a processor configured to execute the computer program to cause the processor perform the method of claim 1.

7. A magnetic resonance imaging (MRI) water-fat image separation apparatus, comprising:

a data acquisition module configured to, within an echo period: acquire a first echo set corresponding to a Dixon water-fat separation calculation under a first readout gradient polarity, and acquire a second echo set corresponding to the Dixon water-fat separation calculation under a second readout gradient polarity, wherein the first readout gradient polarity and the second readout gradient polarity are opposite, echoes in the second echo set being located at positions that are positionally symmetric to echoes in the first echo set with respect to an echo center of the echo period;

an image extraction module configured to: obtain a first echo image set based on first echo set data acquired in each echo period, and obtain a second echo image set based on second echo set data acquired in each echo period, wherein the first echo set and the second echo set each comprise:

one nearly-in-phase echo meeting a set in-phase requirement and one nearly-out-of-phase echo meeting a set out-of-phase requirement, the Dixon water-fat separation calculation being a two-point Dixon water-fat separation calculation; or two nearly-in-phase echoes meeting a set in-phase requirement and one nearly-out-of-phase echo meeting a set out-of-phase requirement, the Dixon water-fat separation calculation being a three-point Dixon water-fat separation calculation; and a water-fat separation module configured to perform Dixon water-fat separation calculation, based on the first echo image set and the second echo image set, to obtain a water image and a fat image.

8. The MRI water-fat image separation apparatus as claimed in claim 7, wherein the water-fat separation module comprises:

a first image integrator configured to: separately subject each pair of echo images with symmetrical echo positions in the first echo image set and the second echo image set to phase difference correction, and separately subject each pair of echo images resulting from phase difference correction to complex averaging to obtain a corresponding echo averaged image set; and a first water-fat separation calculator configured to perform a Dixon water-fat separation calculation, based on the images in the echo averaged image set, to obtain a water image and a fat image.

9. The MRI water-fat image separation apparatus as claimed in claim 8, wherein the first image integrator comprises:

a complex conjugate transformer configured to subject either one of each pair of echo images with symmetrical echo positions in the first echo image set and the second echo image set to complex conjugate transformation, to obtain a first processing image;

a phase subtractor configured to subtract, from the first processing image or the other echo image that has not undergone complex conjugate transformation, a low-pass phase difference between the first processing image and the echo image that has not undergone complex conjugate transformation, to obtain a second processing image, wherein the second processing image and the echo image which has not had the low-pass phase difference subtracted therefrom together form two echo images resulting from phase difference correction; and a complex average calculator configured to separately subject each pair of echo images resulting from phase difference correction to complex averaging to obtain a corresponding echo averaged image set.

10. The MRI water-fat image separation apparatus as claimed in claim 7, wherein the water-fat separator comprises:

a second water-fat separation calculator configured to: perform a Dixon water-fat separation calculation, based on the first echo image set, to obtain a first water image and a first fat image; and perform a Dixon water-fat separation calculation, based on the second echo image set, to obtain a second water image and a second fat image; and a second image integrator configured to: subject the first water image and the second water image to modulus averaging to obtain a water image; and subject the first fat image and the second fat image to modulus averaging to obtain a fat image.

11. A magnetic resonance imaging (MRI) system, comprising the MRI water-fat image separation apparatus as claimed in claim 7.

12. The MRI system as claimed in claim 11, further comprising a magnetic resonance (MR) scanner configured to obtain MR data.

13. A magnetic resonance imaging (MRI) water-fat image separation method, comprising:

within an echo period, acquiring a first echo set corresponding to a Dixon water-fat separation calculation under a first readout gradient polarity, and acquiring a second echo set corresponding to the Dixon water-fat separation calculation under a second readout gradient polarity, wherein the first readout gradient polarity and the second readout gradient polarity are opposite, echoes in the second echo set being located at positions that are positionally symmetric to echoes in the first echo set with respect to an echo center of the echo period;

obtaining a first echo image set based on first echo set data acquired in each echo period;

obtaining a second echo image set based on second echo set data acquired in each echo period; and performing a Dixon water-fat separation calculation, based on the first echo image set and the second echo image set, to obtain a water image and a fat image, wherein performing the Dixon water-fat separation calculation to obtain the water image and the fat image comprises:

(i) separately subjecting each pair of echo images with symmetrical echo positions in the first echo image set and the second echo image set to phase difference correction, separately subjecting each pair of echo images resulting from phase difference correction to complex averaging to obtain a corresponding echo averaged image set, and using images in the echo averaged image set obtained to perform the Dixon water-fat separation calculation to obtain the water image and the fat image; or (ii) performing a Dixon water-fat separation calculation based on the first echo image set to obtain a first water image and a first fat image, performing a Dixon water-fat separation calculation based on the second echo image set to obtain a second water image and a second fat image, subjecting the first water image and the second water image to modulus averaging to obtain a water image, and subjecting the first fat image and the second fat image to modulus averaging to obtain a fat image.

14. A non-transitory computer-readable storage medium with an executable program stored thereon, that when executed, instructs a processor to perform the method of claim 13.

15. A magnetic resonance imaging (MRI) water-fat image separation apparatus, comprising:
- a memory storing a computer program; and
- a processor configured to execute the computer program to cause the processor perform the method of claim 13.

* * * * *